United States Patent
Miki et al.

(10) Patent No.: US 10,278,272 B2
(45) Date of Patent: Apr. 30, 2019

(54) ESD PROTECTION DEVICE

(71) Applicant: Murata Manufacturing Co., Ltd., Nagaokakyo-shi, Kyoto-fu (JP)

(72) Inventors: Takeshi Miki, Nagaokakyo (JP); Hiromitsu Hongo, Nagaokakyo (JP); Takahiro Sumi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/049,880

(22) Filed: Jul. 31, 2018

(65) Prior Publication Data

US 2018/0338372 A1 Nov. 22, 2018

Related U.S. Application Data

(63) Continuation of application No. PCT/JP2016/088049, filed on Dec. 21, 2016.

(30) Foreign Application Priority Data

Apr. 1, 2016 (JP) ................. 2016-074222

(51) Int. Cl.
*H01T 1/20* (2006.01)
*H01T 1/22* (2006.01)
*H01T 2/02* (2006.01)
*H01T 4/10* (2006.01)
*H01T 4/12* (2006.01)
(Continued)

(52) U.S. Cl.
CPC ................. *H05F 3/04* (2013.01); *H01T 1/20* (2013.01); *H01T 4/10* (2013.01); *H01T 4/12* (2013.01); *H05K 1/026* (2013.01); *H01T 1/22* (2013.01); *H01T 2/02* (2013.01)

(58) Field of Classification Search
CPC .. H05F 3/04; H05K 1/026; H01T 1/20; H01T 1/22; H01T 2/02; H01T 4/10; H01T 4/12
USPC ......................................... 361/220
See application file for complete search history.

(56) References Cited

U.S. PATENT DOCUMENTS

| 6,204,549 B1 | 3/2001 | Igel et al. |
| 2012/0162838 A1* | 6/2012 | Sawada ............... H01T 4/12 361/56 |
| 2013/0141826 A1 | 6/2013 | Asakura et al. |

FOREIGN PATENT DOCUMENTS

| JP | 08-83671 A | 3/1996 |
| JP | 11-162615 A | 6/1999 |
| JP | 2002-373759 A | 12/2002 |

(Continued)

OTHER PUBLICATIONS

Official Communication issued in International Patent Application No. PCT/JP2016/088049, dated Feb. 28, 2017.

*Primary Examiner* — Kevin J Comber
(74) *Attorney, Agent, or Firm* — Keating & Bennett, LLP

(57) ABSTRACT

An ESD protection device includes a ceramic element assembly including a glass component, first and second discharge electrodes on the same plane in the ceramic element assembly and opposed to each other with a gap therebetween, a discharge auxiliary electrode that connects the first discharge electrode to the second discharge electrode on the same plane, and a seal layer that is disposed between the discharge auxiliary electrode and the ceramic element assembly and that reduces or prevents a glass component in the ceramic element assembly from entering the discharge auxiliary electrode. The seal layer includes a conductive component.

20 Claims, 8 Drawing Sheets

(51) Int. Cl.
*H05F 3/04* (2006.01)
*H05K 1/02* (2006.01)

(56) References Cited

FOREIGN PATENT DOCUMENTS

| | | |
|---|---|---|
| JP | 2010-108705 A | 5/2010 |
| JP | 2010-231910 A | 10/2010 |
| WO | 2011/040435 A1 | 4/2011 |
| WO | 2012/043576 A1 | 4/2012 |

* cited by examiner

ESD PROTECTION DEVICE

CROSS REFERENCE TO RELATED APPLICATIONS

This application claims the benefit of priority to Japanese Patent Application No. 2016-074222 filed on Apr. 1, 2016 and is a Continuation Application of PCT Application No. PCT/JP2016/088049 filed on Dec. 21, 2016. The entire contents of each application are hereby incorporated herein by reference.

BACKGROUND OF THE INVENTION

1. Field of the Invention

The present invention relates to an ESD protection device.

2. Description of the Related Art

An ESD protection device is described in International Publication No. WO2011/040435. The ESD protection device includes a ceramic element assembly containing a glass component, a first discharge electrode and a second discharge electrode that are disposed in the ceramic element assembly and that oppose each other with a gap therebetween, a discharge auxiliary electrode that connects the first discharge electrode to the second discharge electrode, and a seal layer that suppresses a glass component in the ceramic element assembly from entering the discharge auxiliary electrode.

Incidentally, regarding the ESD protection device in the related art, in order to decrease a discharge starting voltage, the gap between the first discharge electrode and the second discharge electrode has to be reduced or the conductive component in the discharge auxiliary electrode has to be increased. However, these configurations have a problem of degraded insulation quality.

In addition, the seal layer is composed of alumina and, as a result, the degree of shrinkage is low compared to the ceramic element assembly. Therefore, a difference in shrinkage between the ceramic element assembly and the seal layer increases during firing of the ceramic element assembly, and a defect in the ceramic element assembly may occur.

SUMMARY OF THE INVENTION

Preferred embodiments of the present invention provide ESD protection devices that are each able to decrease a discharge starting voltage while maintaining insulation quality and that are able to reduce or prevent generation of a defect in a ceramic element assembly.

An ESD protection device according to a preferred embodiment of the present invention includes a ceramic element assembly including a glass component, a first discharge electrode and a second discharge electrode that are disposed on a same plane in the ceramic element assembly and that oppose each other with a gap therebetween, a discharge auxiliary electrode that connects the first discharge electrode to the second discharge electrode on the same plane, and a seal layer that is disposed between the discharge auxiliary electrode and the ceramic element assembly and that reduces or prevents a glass component in the ceramic element assembly from entering the discharge auxiliary electrode, wherein the seal layer includes a conductive component.

In an ESD protection device according to a preferred embodiment of the present invention, the seal layer includes the conductive component and, therefore, electrons are released from the conductive component. The discharge starting voltage is decreased, due to the released electrons, without changing the gap between the first discharge electrode and the second discharge electrode and the composition of the discharge auxiliary electrode. Consequently, it is possible to decrease the discharge starting voltage while maintaining insulation quality.

Also, the seal layer includes the conductive component and, therefore, the shrinkage characteristics of the seal layer during firing of the ceramic element assembly is improved, and a difference in shrinkage between the ceramic element assembly and the seal layer is reduced. Consequently, generation of a defect in the ceramic element assembly due to the difference in shrinkage between the ceramic element assembly and the seal layer is reduced or prevented.

In an ESD protection device according to a preferred embodiment of the present invention, a hollow portion is located inside the ceramic element assembly, the hollow portion includes the gap between the first discharge electrode and the second discharge electrode, and the seal layer faces the hollow portion.

According to the above-described preferred embodiment, a hollow portion is located inside the ceramic element assembly, the hollow portion includes the gap between the first discharge electrode and the second discharge electrode, and the seal layer faces the hollow portion. Consequently, electrons released from the seal layer are supplied to the hollow portion, and the discharge starting voltage is able to be decreased.

In an ESD protection device according to a preferred embodiment of the present invention, the amount of the conductive component included in the seal layer is less than the amount of the conductive component included in the discharge auxiliary electrode.

According to the above-described preferred embodiment, the amount of the conductive component included in the seal layer is less than the amount of the conductive component included in the discharge auxiliary electrode and, therefore, the discharge characteristics of the seal layer are poorer than the discharge characteristics of the discharge auxiliary electrode. Consequently, discharge via the seal layer does not occur, and discharge occurs between the first discharge electrode and the second discharge electrode via the discharge auxiliary electrode.

In an ESD protection device according to a preferred embodiment of the present invention, an amount of the conductive component included in the seal layer is about 15% by volume or more and about 45% by volume or less.

According to the above-described preferred embodiment, the amount of the conductive component included in the seal layer is about 15% by volume or more and about 45% by volume or less and, therefore, stable compatibility between the discharge characteristics and the short-circuit withstanding capability is ensured.

In an ESD protection device according to a preferred embodiment of the present invention, the seal layer is located at least in a region opposing the discharge auxiliary electrode with respect to the first discharge electrode and the second discharge electrode, and the conductive component is included in only the seal layer located in the opposing region.

According to the above-described preferred embodiment, the conductive component is included in only the seal layer located in the opposing region to the discharge auxiliary electrode with respect to the first discharge electrode and the second discharge electrode and, therefore, there is no interaction between the discharge auxiliary electrode and the conductive component included in the seal layer. Consequently, the function of the discharge auxiliary electrode does not change, and the discharge characteristics and the short-circuit withstanding characteristics are more stably obtained.

In an ESD protection device according to a preferred embodiment of the present invention, the conductive component included in the seal layer is the same material as the conductive component included in the first discharge electrode and the second discharge electrode.

According to the above-described preferred embodiment, the conductive component included in the seal layer is the same material as the conductive component included in the first discharge electrode and the second discharge electrode and, therefore, close-contact forces between the first discharge electrode and the seal layer and between the second discharge electrode and the seal layer are improved. Consequently, an occurrence of cracking in the ceramic element assembly due to occurrences of peeling between the first discharge electrode and the seal layer and between the second discharge electrode and the seal layer are reduced or prevented.

In an ESD protection device according to a preferred embodiment of the present invention, at least a portion of the conductive component included in the seal layer is exposed to the hollow portion.

According to the above-described preferred embodiment, at least a portion of the conductive component included in the seal layer is exposed to the hollow portion. Consequently, starting points of releasing electrons from the conductive component are generated, and electrons are more readily released.

In an ESD protection device according to a preferred embodiment of the present invention, a hollow portion is located inside the ceramic element assembly, the hollow portion includes the gap between the first discharge electrode and the second discharge electrode, and the seal layer faces the hollow portion, the seal layer is located at least in a region opposing the discharge auxiliary electrode with respect to the first discharge electrode and the second discharge electrode, and the seal layer located in the opposing region includes the conductive component.

According to the above-described preferred embodiment, the seal layer located in the region opposing the discharge auxiliary electrode includes the conductive component. Consequently, electrons are readily released into the hollow portion from the conductive component in the seal layer facing the hollow portion, and a discharge starting voltage is decreased.

In an ESD protection device according to a preferred embodiment of the present invention, in the XZ section including the X-direction in which the first discharge electrode and the second discharge electrode oppose each other and the Z-direction in which the first discharge electrode and the discharge auxiliary electrode oppose each other and the second discharge electrode and the discharge auxiliary electrode oppose each other, the maximum distance a in the Z-direction of the hollow portion is less than the minimum distance d in the X-direction of the gap between the first discharge electrode and the second discharge electrode.

According to the above-described preferred embodiment, in the Z-direction, the seal layer is set close to the gap between the first discharge electrode and the second discharge electrode. Consequently, electrons are readily released from the conductive component in the seal layer, and a discharge starting voltage is further decreased.

In an ESD protection device according to a preferred embodiment of the present invention, in the XZ section including the X-direction in which the first discharge electrode and the second discharge electrode oppose each other and the Z-direction in which the first discharge electrode and the discharge auxiliary electrode oppose each other and the second discharge electrode and the discharge auxiliary electrode oppose each other, the maximum distance b in the X-direction of the hollow portion is more than the minimum distance d in the X-direction of the gap between the first discharge electrode and the second discharge electrode.

According to the above-described preferred embodiment, the seal layer is spaced away from the gap between the first discharge electrode and the second discharge electrode in the X-direction. Consequently, discharging is performed primarily in the gap, and discharging is performed via the conductive component in the seal layer in a supplementary manner.

In an ESD protection device according to a preferred embodiment of the present invention, the area of a region surrounded by the outline of the seal layer is more than the area of a region surrounded by the outline of the discharge auxiliary electrode when viewed in a direction orthogonal or substantially orthogonal to the same plane.

According to the above-described preferred embodiment, the glass component in the ceramic element assembly is reduced or prevented from entering the discharge auxiliary electrode.

In an ESD protection device according to a preferred embodiment of the present invention, the region surrounded by the outline of the discharge auxiliary electrode is included in the region surrounded by the outline of the seal layer when viewed in the direction orthogonal or substantially orthogonal to the same plane.

According to the above-described preferred embodiment, the glass component in the ceramic element assembly is further reduced or prevented from entering the discharge auxiliary electrode.

In an ESD protection device according to a preferred embodiment of the present invention, the conductive component includes insulating particles and conductive layers that cover the respective insulating particles.

According to the above-described preferred embodiment, the conductive component includes insulating particles and, therefore, the insulation quality of the seal layer is improved. In addition, the conductive layers cover the respective insulating particles and, therefore, the amount of the conductive layers is able to be reduced. Consequently, the amount of the conductive layers melted due to heat during discharging is able to be reduced, and a plurality of conductive layers, which the conductive component includes, are not readily connected.

In an ESD protection device according to a preferred embodiment of the present invention, the conductive component includes conductive particles, and protruding portions are disposed on the surfaces of the conductive particles.

According to the above-described preferred embodiment, protruding portions are disposed on the surfaces of the conductive particles. Consequently, electrons are readily released from the protruding portions that define and function as starting points.

With the ESD protection devices according to preferred embodiments of the present invention, the seal layer includes the conductive component. Consequently, it is possible to decrease the discharge starting voltage while maintaining insulation quality and to reduce of prevent generation of a defect in the ceramic element assembly.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

First Preferred Embodiment

Figure 1:
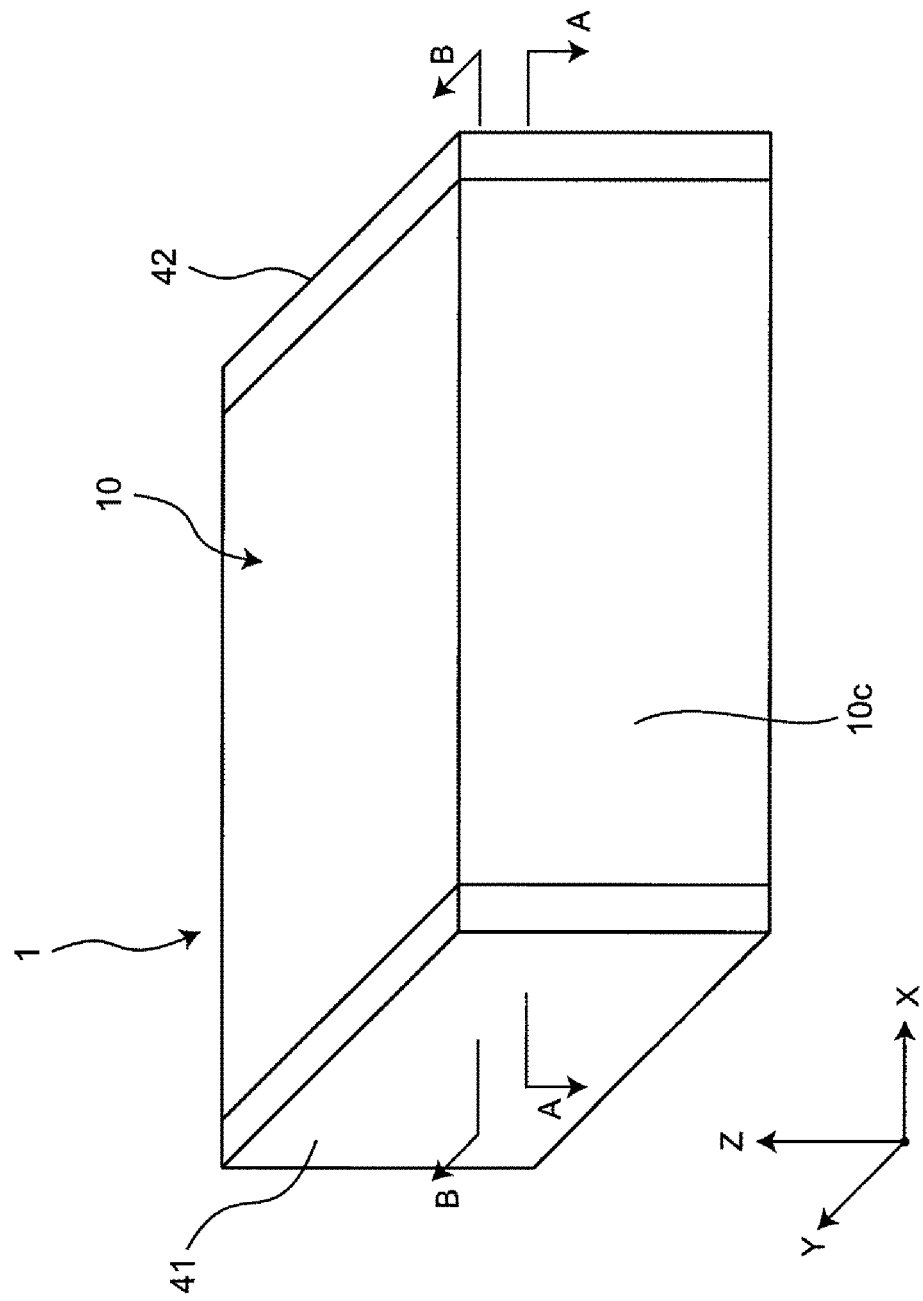
FIG. 1 is a perspective view showing an ESD protection device according to a first preferred embodiment of the present invention.
Figure 2:
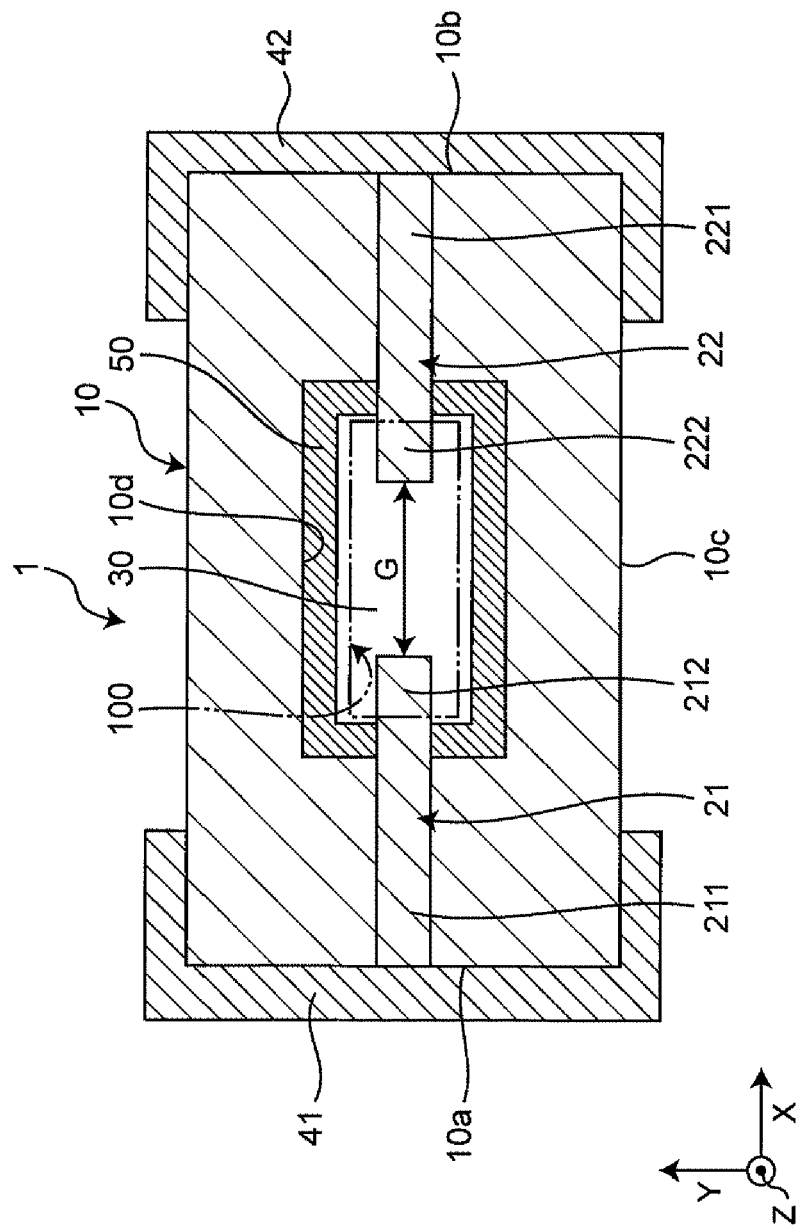
FIG. 2 is a sectional view along line A-A in FIG. 1.
Figure 3:
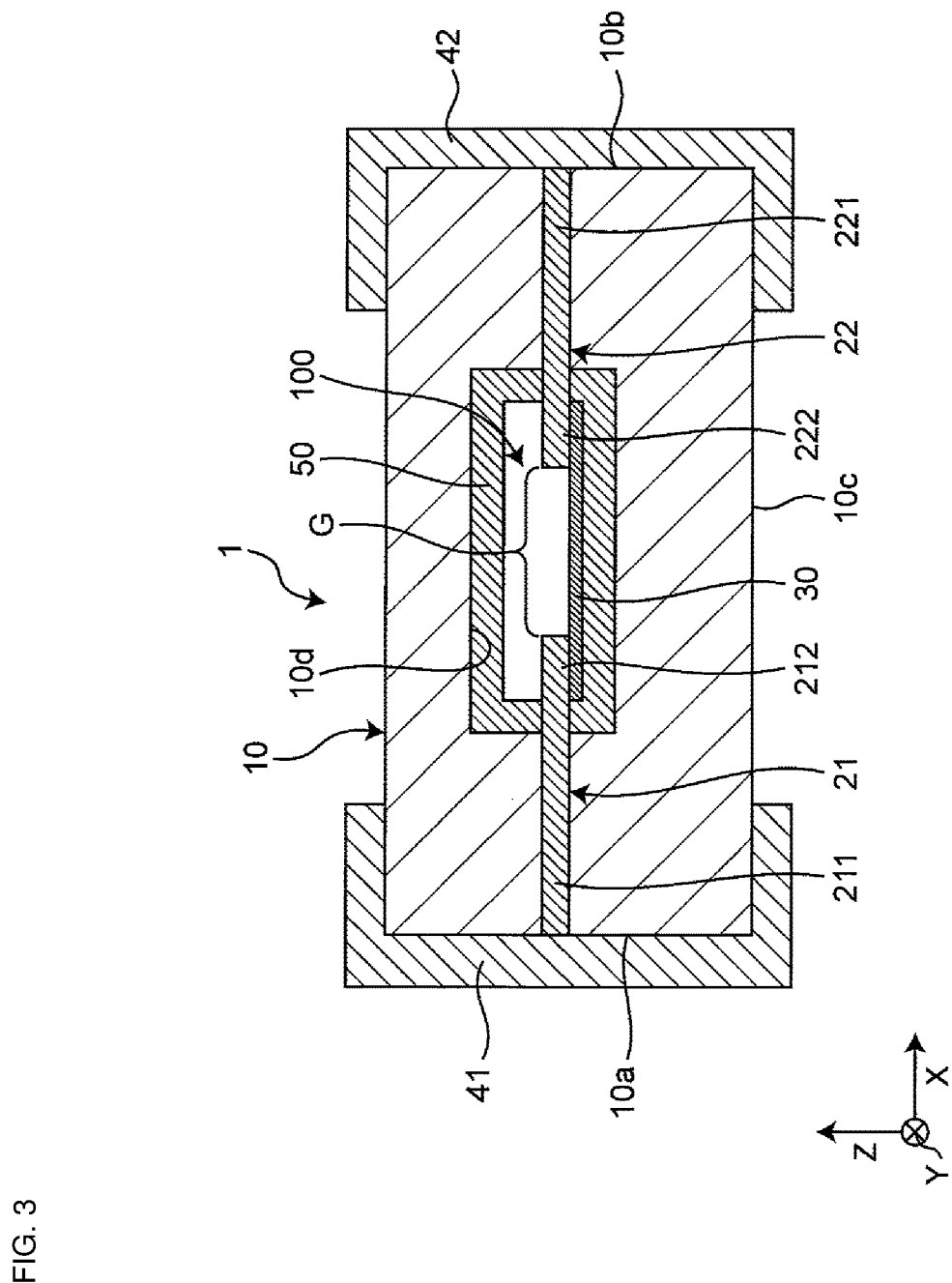
FIG. 3 is a sectional view along line B-B in FIG. 1.

FIG. 1 is a perspective view showing an ESD protection device according to a first preferred embodiment of the present invention. FIG. 2 is a sectional view along line A-A in FIG. 1. FIG. 3 is a sectional view along line B-B in FIG. 1. As shown in FIG. 1, FIG. 2, and FIG. 3, an ESD (electro-static discharge) protection device 1 includes a ceramic element assembly 10 including a glass component, a first discharge electrode 21, a second discharge electrode 22, a discharge auxiliary electrode 30, and a seal layer 50 that are disposed in the ceramic element assembly 10, and a first outer electrode 41 and a second outer electrode 42 that are disposed on the outer surface of the ceramic element assembly 10.

The ceramic element assembly 10 has a rectangular or substantially rectangular parallelepiped shape and has a length, a width, and a height. The length direction of the ceramic element assembly 10 is denoted as the X-direction, the width direction of the ceramic element assembly 10 is denoted as the Y-direction, and the height direction of the ceramic element assembly 10 is denoted as the Z-direction. The outer surface of the ceramic element assembly 10 includes a first end surface 10a, a second end surface 10b located opposite to the first end surface 10a, and a circumferential surface 10c located between the first end surface 10a and the second end surface 10b. The first end surface 10a and the second end surface 10b are located in the X-direction.

The first discharge electrode 21 and the second discharge electrode 22 are disposed on the same plane in the ceramic element assembly 10. One end of the first discharge electrode 21 and one end of the second discharge electrode 22 are opposed to each other with a gap G therebetween. The direction in which the first discharge electrode 21 and the second discharge electrode 22 oppose each other is in the X-direction. The first discharge electrode 21 is connected to the first outer electrode 41, and the second discharge electrode 22 is connected to the second outer electrode 42.

The discharge auxiliary electrode 30 connects the first discharge electrode 21 to the second discharge electrode 22 on the same plane and faces the gap G. The seal layer 50 that reduces or prevents the glass component in the ceramic element assembly 10 from entering the discharge auxiliary electrode 30 is disposed between the discharge auxiliary electrode 30 and the ceramic element assembly 10.

A hollow portion 100 is located inside the ceramic element assembly 10. The hollow portion 100 includes the gap G between the first discharge electrode 21 and the second discharge electrode 22, and the seal layer 50 faces the hollow portion 100. A portion opposite the second discharge electrode 22 of the first discharge electrode 21 and a portion opposite the second discharge electrode 21 of the second discharge electrode 22 are exposed to the hollow portion 100. A space surrounded by the seal layer 50, the discharge auxiliary electrode 30, the first discharge electrode 21, and the second discharge electrode 22 defines the hollow portion 100. The seal layer 50 includes the conductive component. The amount of the conductive component included in the seal layer 50 is preferably less than the amount of the conductive component included in the discharge auxiliary electrode 30.

The ESD protection device 1 is used for, for example, electronic equipment so as to discharge static electricity generated in the electronic equipment and to reduce or prevent breakage of the electronic equipment due to the static electricity. Specifically, when the first outer electrode 41 is connected to a terminal of the electronic equipment and the second outer electrode is connected to the ground, the static electricity of the electronic equipment is transferred from the first outer electrode 41 and the first discharge electrode 21 to the second discharge electrode 22 and the second outer electrode 42.

Discharge of static electricity from the first discharge electrode 21 to the second discharge electrode 22 includes aerial discharge and discharge via the discharge auxiliary electrode 30. The aerial discharge is discharge that transfers in the hollow portion 100. The discharge via the discharge auxiliary electrode includes discharge (surface creepage) due to a current that passes along the surface of the discharge auxiliary electrode 30 and discharge due to a current that passes inside the discharge auxiliary electrode 30.

The ceramic element assembly 10 is formed by stacking and firing a plurality of ceramic layers, for example. The ceramic layers include a glass component. The ceramic layers are preferably made of, for example, low temperature co-fired ceramics (LTCC) including Ba, Al, and Si as primary components.

Each of the first discharge electrode 21 and the second discharge electrode 22 has a band shape that extends in the X-direction. The first discharge electrode 21 and the second discharge electrode 22 are arranged opposite each other in the X-direction. The first discharge electrode 21 and the second discharge electrode 22 are preferably made of an appropriate material, for example, Cu, Ag, Pd, Pt, Al, Ni, or W or an alloy including at least one of Cu, Ag, Pd, Pt, Al, Ni, or W.

A first end portion 211 in the longitudinal direction of the first discharge electrode 21 is exposed at the first end surface 10a of the ceramic element assembly 10. The second end portion 212 in the longitudinal direction of the first discharge electrode 21 is located in the ceramic element assembly 10. The first end portion 221 in the longitudinal direction of the second discharge electrode 22 is exposed at the second end surface 10b of the ceramic element assembly 10. The second end surface 222 in the longitudinal direction of the second discharge electrode 22 is located in the ceramic element assembly 10. The second end portion 212 of the first discharge electrode 21 and the second end portion 222 of the second discharge electrode 22 oppose each other with the gap G located therebetween.

The discharge auxiliary electrode 30 is located under the gap G when viewed in the Z-direction. The discharge auxiliary electrode 30 has a rectangular or substantially rectangular shape when viewed in the Z-direction. The discharge auxiliary electrode connects the second end portion 212 of the first discharge electrode 21 to the second end portion 222 of the second discharge electrode 22.

The discharge auxiliary electrode 30 is preferably made of, for example, a mixture of a conductive component and an insulating component. The conductive component may be, for example, Cu, Ag, Pd, Pt, Al, Ni, or W or a combination thereof. In this regard, a material having a lower electrical conductivity than a metal material, for example, a semiconductor material or a resistive material, e.g., a SiC powder, may preferably be used as the conductive component. Examples of the semiconductor material may include metal semiconductors, e.g., Si and Ge, carbides, e.g., SiC, TiC, ZrC, and WC, nitrides, e.g., TiN, ZrN, chromium nitride, VN, and TaN, silicides, e.g., titanium silicide, zirconium silicide, tungsten silicide, molybdenum silicide, and chromium silicide, borides, e.g., titanium boride, zirconium boride, chromium bolide, lanthanum boride, molybdenum boride, and tungsten boride, and oxides, e.g., strontium titanate. In this regard, at least two of the above-described materials may be appropriately mixed. In addition, the conductive component may be coated with an inorganic material. There is no particular limitation regarding the inorganic material, and an inorganic material, e.g., $Al_2O_3$, $ZrO_2$, or $SiO_2$, a mixed and calcined powder of materials that define ceramic base materials, or other suitable materials may be used. Examples of the insulating component may include oxides, e.g., $Al_2O_3$, $SiO_2$, $ZrO_2$, and $TiO_2$, nitrides, e.g., $Si_3N_4$ and AlN, mixed and calcined powders of materials to define ceramic base materials, and vitreous materials and combinations thereof.

The seal layer 50 is disposed along the inner surface of a hole portion 10d in the ceramic element assembly 10 and on the entire or substantially the entire inner surface of the hole portion 10d. The discharge auxiliary electrode 30 is disposed on one surface of the inner surface of the seal layer 50. That is, the discharge auxiliary electrode 30 is covered with the seal layer 50. The first discharge electrode 21 and the second discharge electrode 22 pass through the seal layer 50 and extend into the hollow portion 100 so as to come into contact with the discharge auxiliary electrode 30. A space surrounded by the seal layer 50, the discharge auxiliary electrode 30, the first discharge electrode 21, and the second discharge electrode 22 defines the hollow portion 100.

The seal layer 50 is preferably made of, for example, a mixture of the conductive component and the insulating component. The insulating component is preferably, for example, an inorganic oxide. The inorganic oxide is preferably, for example, $Al_2O_3$, but may be an inorganic oxide, e.g., BaO, CaO, $TiO_2$, $ZrO_2$, SrO, or $Nb_2O_5$. The conductive component is preferably, for example, Cu, but may be another metal, e.g., Ag, Pd, Pt, Al, Ni, or W. Further, the conductive component may be a combination of metals, e.g., Cu and Ni.

The first outer electrode 41 covers the entire or substantially the entire first end surface 10a and, in addition, the first-end-surface-10a-side end portion of the circumferential surface 10c. The first end surface 41 is in contact with and electrically connected to the first end portion 211 of the first discharge electrode 21. The second outer electrode 42 covers the entire or substantially the entire second end surface 10b and, in addition, the second-end-surface-10b-side end portion of the circumferential surface 10c. The second outer electrode 42 is in contact with and electrically connected to the first end portion 221 of the second discharge electrode 22. The first outer electrode 41 and the second outer electrode 42 are preferably made of an appropriate material, for example, Cu, Ag, Pd, Pt, Al, Ni, or W or an alloy containing at least one of Cu, Ag, Pd, Pt, Al, Ni, or W.

According to the ESD protection device 1, the seal layer 50 includes the conductive component and, therefore, electrons are released from the conductive component. The discharge starting voltage is decreased, due to the released electrons, without changing the gap G between the first discharge electrode 21 and the second discharge electrode 22 or the composition of the discharge auxiliary electrode 30. Consequently, it is possible to decrease the discharge starting voltage while maintaining insulation quality.

Also, the seal layer 50 includes the conductive component and, therefore, the shrinkage characteristics of the seal layer 50 during firing of the ceramic element assembly 10 are improved, and a difference in shrinkage between the ceramic element assembly 10 and the seal layer 50 is reduced. Consequently, generation of a defect in the ceramic element assembly 10 due to the difference in shrinkage between the ceramic element assembly 10 and the seal layer 50 is reduced or prevented.

A hollow portion 100 is located inside the ceramic element assembly 10, the hollow portion 100 includes the gap G between the first discharge electrode 21 and the second discharge electrode 22, and the seal layer 50 faces the hollow portion 100. Consequently, electrons released from the conductive component of the seal layer 50 are supplied to the hollow portion 100, and the discharge starting voltage is decreased.

The amount of the conductive component included in the seal layer 50 is preferably less than the amount of the conductive component included in the discharge auxiliary electrode 30 and, therefore, the discharge characteristics of the seal layer 50 are poorer than the discharge characteristics of the discharge auxiliary electrode 30. Consequently, discharge via the seal layer does not occur, but discharge between the first discharge electrode 21 and the second discharge electrode 22 via the discharge auxiliary electrode 30 does occur.

The amount of the conductive component included in the seal layer 50 is preferably about 15% by volume or more and about 45% by volume or less, for example. Therefore, stable compatibility between the discharge characteristics and the short-circuit withstanding capability is ensured. On the other hand, if the amount of the conductive component in the seal layer 50 increases, conduction occurs between the seal layer 50 and the first discharge electrode 21 and between the seal layer 50 and the second discharge electrode 22 so as to degrade the short-circuit withstanding capability. If the amount of the conductive component in the seal layer 50 decreases, improved the discharge characteristics cannot be achieved.

Preferably, the conductive component is included in only the seal layer 50 located in the region opposite the discharge auxiliary electrode 30 with respect to the first discharge electrode 21 and the second discharge electrode 22. In this regard, the seal layer 50 may be located in at least the opposing region.

Therefore, there is no interaction between the discharge auxiliary electrode 30 and the conductive component included in the seal layer 50. Consequently, the function of the discharge auxiliary electrode 30 does not change, and the discharge characteristics and the short-circuit withstanding characteristics are more stably obtained. On the other hand, if a conductive component is added to the seal layer 50 on the discharge auxiliary electrode 30 side, a reaction occurs between the conductive component in the seal layer 50 and the discharge auxiliary electrode 30 and the function of the discharge auxiliary electrode 30 may be changed.

Preferably, the conductive component included in the seal layer 50 is the same material as the conductive component included in the first discharge electrode 21 and the second discharge electrode 22. Therefore, close-contact forces between the first discharge electrode 21 and the seal layer 50 and between the second discharge electrode 22 and the seal layer 50 are improved. Consequently, an occurrence of cracking in the ceramic element assembly 10 due to occurrences of peeling between the first discharge electrode 21 and the seal layer 50 and between the second discharge electrode 22 and the seal layer 50 is reduced or prevented.

Figure 4:
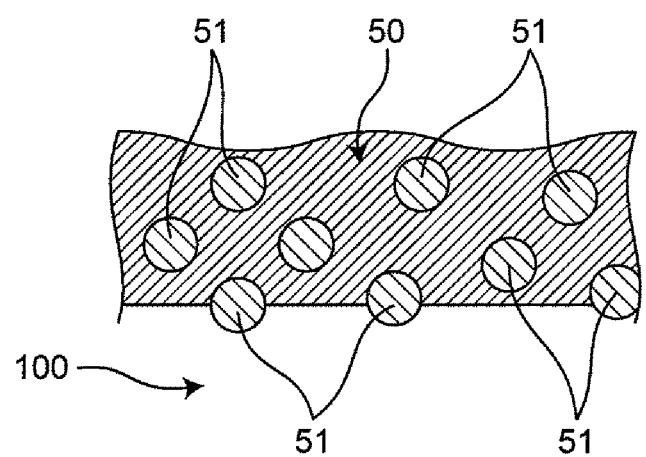
FIG. 4 is a magnified sectional view showing a seal layer.

As shown in FIG. 4, preferably, at least a portion of the conductive component 51 included in the seal layer 50 is exposed to the hollow portion 100. Consequently, starting points of releasing electrons from the conductive component 51 are generated, and electrons are more readily released.

The average particle diameter of a powder defining the conductive component is preferably less than about 3 μm, for example. Therefore, the average particle diameter of powder is made small so that the amount of the powder included in the seal layer is able to be increased. As a result, the specific surface area of the powder increases, and electrons are readily released. The average particle diameter of the powder defining the conductive component is preferably more than about 0.01 μm, for example. Consequently, the powder is able to be reliably produced.

Second Preferred Embodiment

Figure 5:
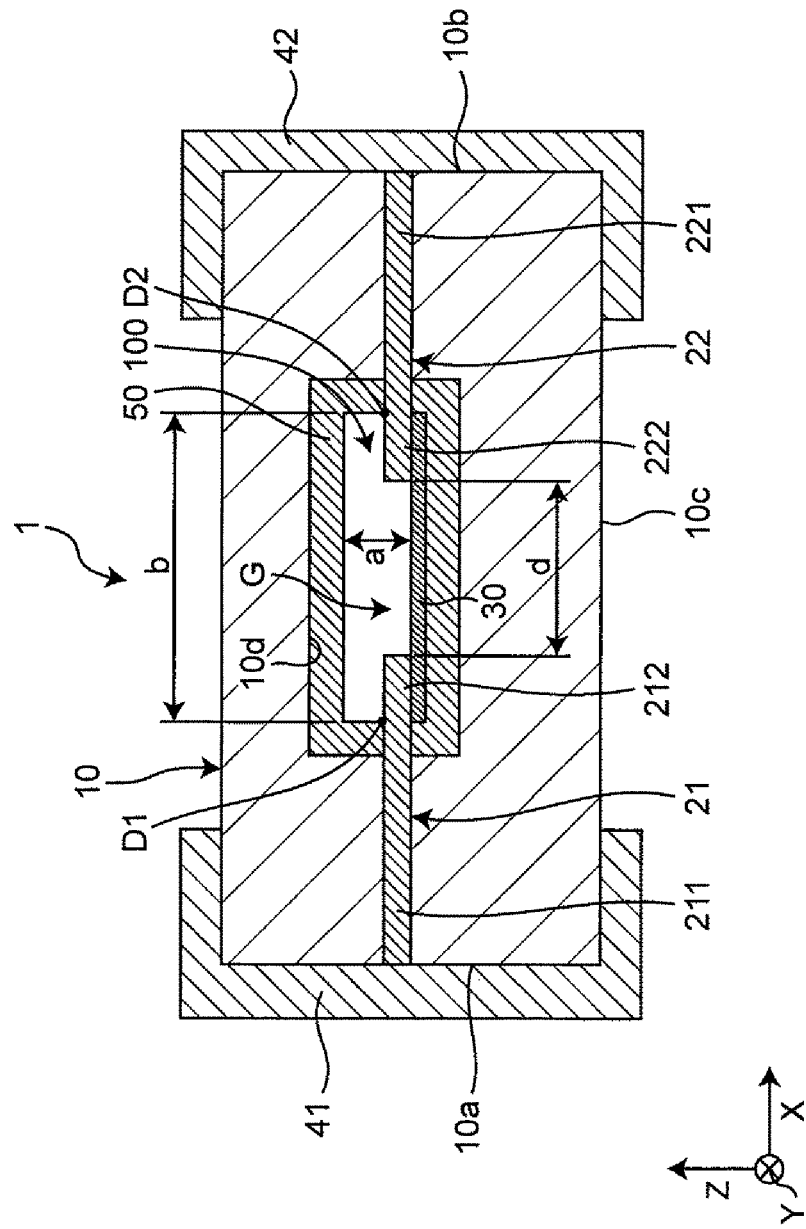
FIG. 5 is an XZ sectional view showing an ESD protection device according to a second preferred embodiment of the present invention.
Figure 6:
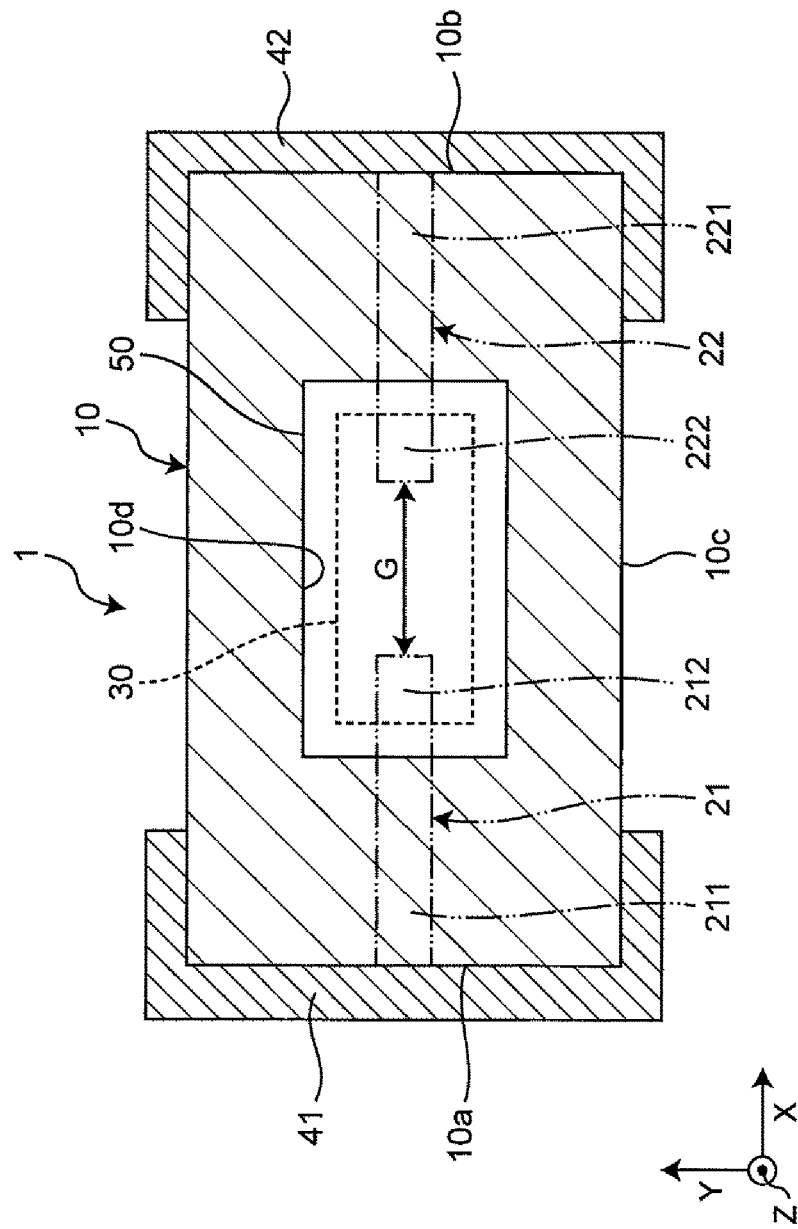
FIG. 6 is an XY sectional view showing an ESD protection device according to a third preferred embodiment of the present invention.

FIG. 5 is an XZ sectional view showing an ESD protection device according to a second preferred embodiment of the present invention. FIG. 6 is an XY sectional view showing the ESD protection device. In the second preferred embodiment, dimensions of the first preferred embodiment are specified. In the second preferred embodiment, the same or substantially the same configurations as in the first preferred embodiment are indicated by the same reference numerals as in the first preferred embodiment, and explanations thereof will not be provided.

As shown in FIG. 5, a hollow portion 100 is located inside the ceramic element assembly 10, the hollow portion 100 includes the gap G between the first discharge electrode 21 and the second discharge electrode 22, and the seal layer 50 faces the hollow portion 100, as in the first preferred embodiment. The seal layer 50 is located at least in a region opposite the discharge auxiliary electrode 30 with respect to the first discharge electrode 21 and the second discharge electrode 22. The seal layer 50 located in the opposing region includes the conductive component. Consequently, electrons are readily released into the hollow portion 100 from the conductive component in the seal layer 50 facing the hollow portion 100, and a discharge starting voltage is decreased.

In the XZ section including the X-direction in which the first discharge electrode 21 and the second discharge electrode 22 are opposed to each other and the Z-direction in which the first discharge electrode 21 and the discharge auxiliary electrode 30 are opposed to each other and the second discharge electrode 22 and the discharge auxiliary electrode 30 are opposed to each other, the maximum distance a in the Z-direction of the hollow portion 100 is preferably less than the minimum distance d in the X-direction of the gap G between the first discharge electrode 21 and the second discharge electrode 22. Specifically, in FIG. 5, the maximum distance a in the Z-direction of the hollow portion 100 is the distance between the upper surface of the discharge auxiliary electrode 30 and the lower surface of the seal layer 50. The minimum distance d in the X-direction of the gap G is the distance between the end surface of the second end portion 212 of the first discharge electrode 21 and the end surface of the second end portion 222 of the second discharge electrode 22. Consequently, in the Z-direction, the seal layer 50 is close to the gap G between the first discharge electrode 21 and the second discharge electrode 22, electrons are readily released from the conductive component in the seal layer 50, and a discharge starting voltage is further decreased.

In the XZ section, the maximum distance b in the X-direction of the hollow portion 100 is preferably more than the minimum distance d in the X-direction of the gap G between the first discharge electrode 21 and the second discharge electrode 22. Specifically, in FIG. 5, the maximum distance b in the X-direction of the hollow portion 100 is the distance between a first contact point D1 at which the inner surface of the seal layer 50 is in contact with the upper surface of the first discharge electrode 21 and a second contact point D2 at which the inner surface of the seal layer 50 is in contact with the upper surface of the second discharge electrode 22. Consequently, in the X-direction, discharging is performed primarily in the gap G, and discharging is performed via the conductive component in the seal layer 50 in a supplementary manner because the seal layer 50 is spaced away from the gap G between the first discharge electrode 21 and the second discharge electrode 22.

As shown in FIG. 6, the area of a region surrounded by the outline of the seal layer 50 is preferably more than the area of a region surrounded by the outline of the discharge auxiliary electrode 30 when viewed in the direction orthogonal or substantially orthogonal to the same plane on which the first discharge electrode 21 and the second discharge electrode 22 are disposed (Z-direction). In FIG. 6, the outline of the seal layer 50 is indicated by a solid line, and the outline of the discharge auxiliary electrode 30 is indicated by a dotted line. The first discharge electrode 21 and the second discharge electrode 22 are indicated by virtual lines.

Specifically, the area in the outline of the seal layer 50 opposite the discharge auxiliary electrode 30 is more than the area in the outline of the discharge auxiliary electrode 30 when viewed in the Z-direction. Consequently, the glass component in the ceramic element assembly 10 is reduced or prevented from entering the discharge auxiliary electrode 30.

In addition, the region surrounded by the outline of the discharge auxiliary electrode 30 is included in the region surrounded by the outline of the seal layer 50 when viewed in the direction orthogonal or substantially orthogonal to the same plane (Z-direction). Specifically, the outline of the discharge auxiliary electrode 30 is included in the outline of the seal layer 50 opposite the discharge auxiliary electrode 30 when viewed in the Z-direction. Consequently, the glass component in the ceramic element assembly 10 is further reduced or prevented from entering the discharge auxiliary electrode 30.

In this regard, at least one of the above-described specifications of the dimensions may be satisfied.

Third Preferred Embodiment

Figure 7A:
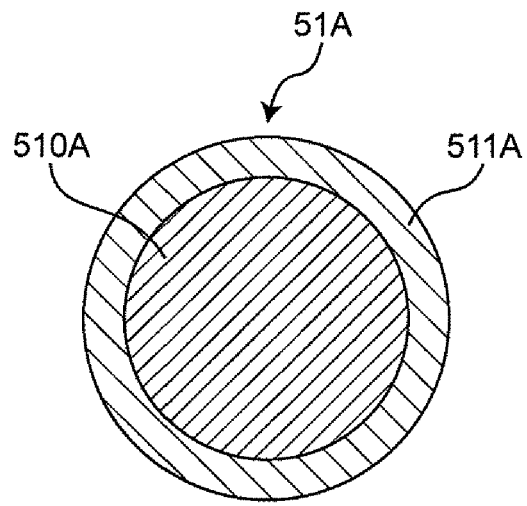
FIG. 7A is a sectional view showing another preferred embodiment of a conductive component according to a preferred embodiment of the present invention.
Figure 7B:
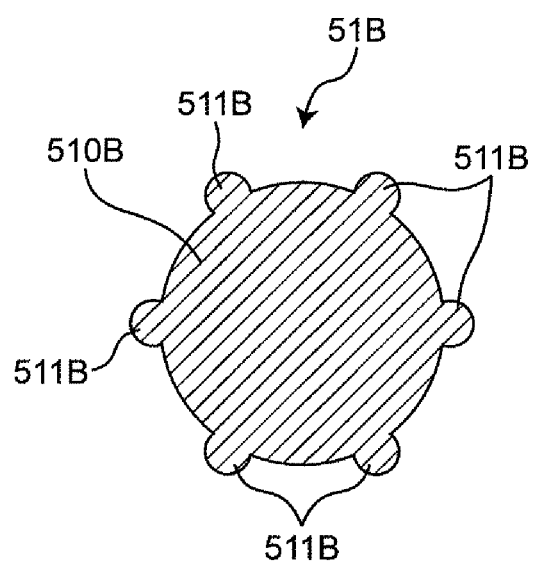
FIG. 7B is a sectional view showing another preferred embodiment of the present invention.

FIG. 7A is a sectional view showing a third preferred embodiment of a conductive component according to the present invention. FIG. 7B is a sectional view showing another preferred embodiment of the conductive component according to the present invention.

As shown in FIG. 7A, preferably, a conductive component 51A is a powder and includes an insulating particle 510A and a conductive layer 511A that covers the insulating particle 510A. Examples of the material used for the insulating particle 510A include oxides, e.g., $Al_2O_3$, $SiO_2$, $ZrO_2$, and $TiO_2$, and nitrides, e.g., $Si_3N_4$ and AlN. The material used for the conductive layer 511A is preferably, for example, Cu but may be another metal, e.g., Ag, Pd, Pt, Al, Ni, or W.

Therefore, the conductive component includes the insulating particles 510A, and the insulation quality of the seal layer is improved. In addition, the conductive layers 511A cover the respective insulating particles 510A and, thus, the amount of the conductive layers 511A is reduced. Consequently, the amount of the conductive layers 511A melted due to heat during discharging is reduced, and a plurality of conductive layers 511A defining the conductive component are not readily connected to each other.

As shown in FIG. 7B, a conductive component 51B is a powder and includes a conductive particle 510B. A plurality of protruding portions 511B are disposed on the surface of the conductive particle 510B. The material used for the conductive particle 510B is preferably, for example, Cu but may be another metal, e.g., Ag, Pd, Pt, Al, Ni, or W. The material used for the protruding portions 511B is preferably the same as the material used for the conductive particle 510B. The protruding portions 511B are disposed on the surface of the conductive particle 510B and, therefore, electrons are readily released where protruding portions 511B define and function as starting points.

Fourth Preferred Embodiment

Figure 8:
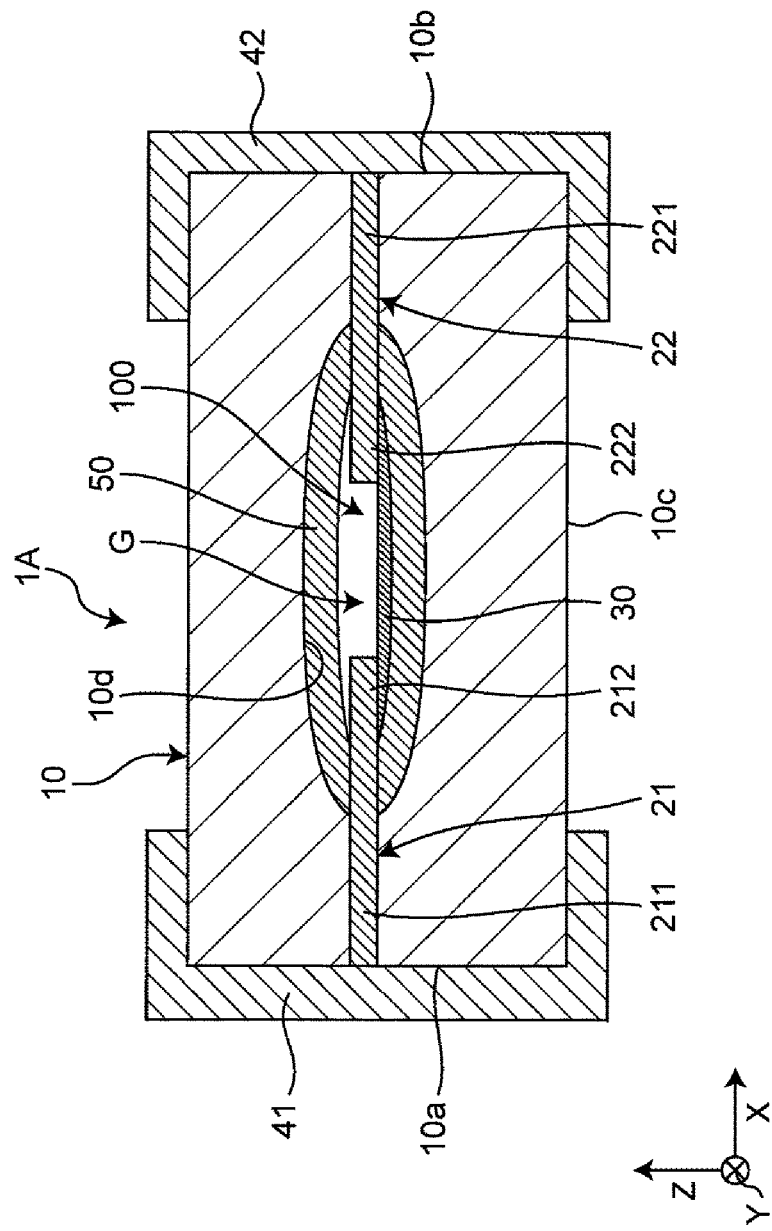
FIG. 8 is an XZ sectional view showing an ESD protection device according to a fourth preferred embodiment of the present invention.

FIG. 8 is an XZ sectional view showing an ESD protection device according to a fourth preferred embodiment of the present invention. The fourth preferred embodiment is different from the first preferred embodiment in the shape of the hole portion in the ceramic element assembly and the shape of the seal layer. Other configurations are the same or substantially the same as the configurations in the first preferred embodiment and are indicated by the same reference numerals as in the first preferred embodiment, and explanations thereof will not be provided.

As shown in FIG. 8, in an ESD protection device 1A, the inner surface shape of a hole portion 10d in the ceramic element assembly 10 is elliptical or substantially elliptical in the XZ section and is specified by the major axis in the X-direction and the minor axis in the Z-direction. Further, the seal layer 50 has an arc shape that curves along the inner surface of an elliptical or substantially elliptical hole portion 10d. In accordance with this, the hollow portion 100 has a shape in which a central portion in the X-direction is wide. At this time, the maximum distance a in the Z-direction of the hollow portion 100 described in the second preferred embodiment refers to the distance in the Z-direction at the central portion in the X-direction of the hollow portion 100.

Consequently, the seal layer 50 having an arc shape extends between the first discharge electrode 21 and the second discharge electrode 22, the seal layer 50 is close to the gap G in the Z-direction, electrons are readily released from the conductive component in the seal layer 50, and a discharge starting voltage is decreased.

In this regard, the present invention is not limited to the above-described preferred embodiments, and the design may be changed without departing from the gist of the present invention.

Next, a first example of the ESD protection device will be described.

A manufacturing method in the first example will be described below.

A material (BAS material) having a composition centering on Ba, Al, and Si was used as a ceramic material used for the material forming the ceramic element assembly. Raw materials were compounded and mixed so as to obtain a predetermined composition, and calcination was performed at about 800° C. to about 1,000° C. The resulting calcined powder was ground in a zirconia ball mill for about 12 hours so as to produce a ceramic powder. An organic solvent, e.g., toluene-EKINEN, was added to the resulting ceramic powder, and mixing was performed. Further, a binder and a plasticizer were added and mixed so as to produce a slurry. The slurry was molded by a doctor blade method so as to obtain ceramic green sheets preferably having a thickness of about 10 μm and ceramic green sheets having a thickness of about 50 μm, for example.

A discharge electrode paste was produced, for example, by compounding about 40% by weight of Cu powder having an average particle diameter of about 1 μm, about 40% by weight of Cu powder having an average particle diameter of about 3 μm, and about 20% by weight of organic vehicle, in which ethyl cellulose was dissolved into terpineol, and by performing mixing by a triple roller mill.

A mixed paste forming a discharge auxiliary electrode was produced, for example, by compounding a CuAl alloy powder having an average particle diameter of about 2 μm and a ceramic powder having an average particle diameter of about 0.5 μm and having a composition centering on Ba, Al, and Si, in a ratio of about 80/20 on a percent by volume basis, adding a binder resin and a solvent, and performing agitation and mixing by a triple roller mill. In the mixed paste, a binder resin of ethyl cellulose or other suitable resin and a solvent were set to be about 20% by weight and the remainder was set to be about 80% by weight of CuAl alloy powder and BAS-based calcined powder.

A hollow portion paste was produced, for example, by compounding about 38% by weight of cross-linked acrylic resin beads having an average particle diameter of about 1 μm and about 62% by weight of organic vehicle, in which about 10% by weight of ETHOCEL resin was dissolved into terpineol, and by performing mixing by a triple roller mill.

A paste forming a seal layer was produced, for example, by compounding an $Al_2O_3$ powder as an inorganic oxide and a Cu powder as a conductive component in a ratio of about 75/25 on a percent by volume basis, adding a binder resin and a solvent, and performing agitation and mixing by a triple roller mill. In the mixed paste, a binder resin of ethyl cellulose or other suitable resin and a solvent were set to be about 44% by weight and the remainder was set to be about 56% by weight of $Al_2O_3$ powder and Cu powder.

An outer electrode paste was produced, for example, by compounding about 80% by weight of Cu powder having an average particle diameter of about 1 μm, about 5% by weight of alkali borosilicate glass frit having a transition point of about 620° C., a softening point of about 720° C., and an average particle diameter of about 1 μm, and about 15% by weight of organic vehicle, in which ethyl cellulose was dissolved into terpineol, and by performing mixing by a triple roller mill.

Initially, a seal paste was applied to the ceramic green sheet, and a discharge auxiliary electrode paste was applied by overcoating. Subsequently, a discharge electrode paste was applied by overcoating in the same manner. The distance between the discharge electrodes was set to be about 20 μm, for example. Further, a hollow portion paste was applied by overcoating.

Finally, the seal layer paste was applied again by overcoating in the same or similar manner.

In this regard, the seal paste and other pastes may be applied directly to coating objects or be applied by another method, e.g., a transfer method.

The ceramic green sheets were stacked and pressure-bonded. Here, stacking was performed such that the thickness became about 0.3 mm, for example.

Division into the individual chips was performed by cutting with a micro-cutter. Here, cutting into about 1.0 mm×about 0.5 mm, for example was performed.

Subsequently, firing was performed in a $N_2$ atmosphere. If the electrode material is not oxidized, firing may be performed in an air atmosphere.

After the firing, the outer electrode was formed by applying an outer electrode paste to the end surface of the ceramic element assembly and performing baking.

The outer electrode was subjected to electrolytic Ni—Sn plating.

In this manner, the ESD protection device was completed. In this regard, the ceramic material used for the substrate is not particularly limited to the above-described material, and an LTCC material in which glass or other material is added to $Al_2O_3$, cordierite, mullite, forsterite, and $CaZrO_3$, a HTCC material including $Al_2O_3$, cordierite, mullite, forsterite, and other suitable materials, a ferrite material, a dielectric material, or a resin material may be used. The electrode material may be not only Cu but also Ag, Pd, Pt, Al, Ni, or W or a combination thereof, and Cu or Ag is preferable because of high thermal conductivity.

The experimental results of the first example will be described below. In a first comparative example for the purpose of comparison with the first example, a coil component in which the seal layer included no conductive component was used. In a second comparative example for the purpose of comparison with the first example, a coil component in which the conductive component in the seal layer was a component (Ni powder) different from the conductive component (Cu powder) in the discharge electrode was used.

Regarding each of the first example and the first comparative example, the discharge starting voltage was measured. These effects were evaluated based on an operation rate when a certain ESD voltage was applied. The ESD voltage was applied to samples, the number N of which was 100, by contact-discharging in conformity with the IEC Standard (IEC61000-4-2), and the operational performance of an element at each applied voltage was examined. Table 1 shows the operational performance when an ESD voltage of about 2 kV to about 5 kV was applied.

TABLE 1

| | Operational performance | | | |
| --- | --- | --- | --- | --- |
| | 2 kV | 3 kV | 4 kV | 5 kV |
| First comparative example | X | Δ | ○ | ⊙ |
| First example | ○ | ⊙ | ⊙ | ⊙ |

The operational performance "×" indicates that the operation rate was about 0% to about 10%. The operational performance "Δ" indicates that the operation rate was about 10% to about 50%. The operational performance "○" indicates that the operation rate was about 50% to about 80%. The operational performance "⊙" indicates that the operation rate was about 80% to about 100%. As shown in Table 1, the first example was superior to the first comparative example.

Regarding each of the first example and the first comparative example, the IR degradation resistance was measured. A certain ESD voltage was applied to samples, the number N of which was 50, by contact-discharging 100 times successively in conformity with the IEC Standard (IEC61000-4-2). A sample that exhibited an IR value reduced to about 10 kΩ or less was determined to be out of order, and non-defective rates were compared. Table 2 shows the IR degradation resistance (non-defective rate) when an ESD voltage of about 8 kV, about 10 kV, or about 12 kV was applied.

TABLE 2

| | IR degradation resistance | | |
| --- | --- | --- | --- |
| | 8 kV | 10 kV | 12 kV |
| First comparative example | ⊙ | ○ | X |
| First example | ⊙ | ○ | X |

The IR degradation resistance "x" indicates that the non-defective rate was about 0% to about 10%. The IR degradation resistance "Δ" indicates that the non-defective rate was about 10% to about 50%. The IR degradation resistance "○" indicates that the non-defective rate was about 50% to about 80%. The IR degradation resistance "⊙" indicates that the non-defective rate was about 80% to about 100%. As shown in Table 2, the first example was equivalent to the first comparative example.

Defects of ceramic element assemblies of the first example and the first comparative example were observed. The surface of each of samples, the number N of which was 10,000, after firing was observed by a stereomicroscope so as to examine whether a crack was present in the six surfaces of the ceramic element assembly. A sample having any surface with a crack was assumed to be defective and the number of samples cracked was counted. Table 3 shows the results of crack evaluation.

TABLE 3

| | Number of samples cracked |
| --- | --- |
| First comparative example | 50 |
| First example | 0 |

As shown in Table 3, the first example was superior to the first comparative example because the ceramic element assemblies in the first example had no defect.

Defects of ceramic element assemblies of the first example and the second comparative example were observed. The surface of each of samples, the number N of which was 10,000, after firing was observed by a stereomicroscope so as to examine whether a crack was present in the six surfaces of the ceramic element assembly. A sample having any surface with a crack was assumed to be defective and the number of samples cracked was counted. Table 4 shows the results of crack evaluation.

TABLE 4

| | Number of samples cracked |
|---|---|
| Second comparative example | 10 |
| First example | 0 |

As shown in Table 4, the first example was superior to the second comparative example because the ceramic element assemblies in the first example had no defect.

Next, a second example of the ESD protection device will be described.

A manufacturing method in the second example will be described below. The second example is different from the first example only in the preparation of the seal layer paste. Only the preparation of the seal layer paste will be described.

Each paste forming a seal layer was produced, for example, by compounding an $Al_2O_3$ powder as an inorganic oxide and a Cu powder as a conductive component in a ratio of about 90/10, about 70/30, or about 50/50 on a percent by volume basis, adding a binder resin and a solvent, and performing agitation and mixing by a triple roller mill. In the mixed paste, a binder resin of ethyl cellulose or other suitable resin and a solvent were set to be about 44% by weight and the remainder was set to be about 56% by weight of $Al_2O_3$ powder and Cu powder.

The experimental results of the second example will be described below.

Regarding the second example, the discharge starting voltage was measured. These effects were evaluated based on an operation rate when a certain ESD voltage was applied. The ESD voltage was applied to samples, the number N of which was 100, by contact-discharging in conformity with the IEC Standard (IEC61000-4-2), and the operational performance of an element at each applied voltage was examined. Table 5 shows the operational performance when about 10% by volume, about 15% by volume, about 30% by volume, or about 50% by volume of Cu powder was added and an ESD voltage of 2 to 5 kV was applied.

TABLE 5

| | Operational performance | | | |
|---|---|---|---|---|
| Amount of Cu powder added | 2 kV | 3 kV | 4 kV | 5 kV |
| 10% by volume | X | Δ | ○ | ⊙ |
| 15% by volume | ○ | ⊙ | ⊙ | ⊙ |
| 30% by volume | ○ | ⊙ | ⊙ | ⊙ |
| 50% by volume | ○ | ⊙ | ⊙ | ⊙ |

The operational performance "x" indicates that the operation rate was about 0% to about 10%. The operational performance "Δ" indicates that the operation rate was about 10% to about 50%. The operational performance "○" indicates that the operation rate was about 50% to about 80%. The operational performance "⊙" indicates that the operation rate was about 80% to about 100%. As shown in Table 5, the operational performance was excellent when the amount of Cu powder added was set to be about 15% by volume or more.

Regarding each of the second example and the first comparative example, the IR degradation resistance was measured. A certain ESD voltage was applied to samples, the number N of which was 50, by contact-discharging 100 times successively in conformity with the IEC Standard (IEC61000-4-2). A sample that exhibited an IR value reduced to about 10 kΩ or less was determined to be out of order, and non-defective rates were compared. Table 6 shows the IR degradation resistance (non-defective rate) when about 10% by volume, about 30% by volume, about 45% by volume, or about 50% by volume of Cu powder was added and an ESD voltage of 8, 10, or 12 kV was applied.

TABLE 6

| | IR degradation resistance | | |
|---|---|---|---|
| Amount of Cu powder added | 8 kV | 10 kV | 12 kV |
| 10% by volume | ⊙ | ○ | X |
| 30% by volume | ⊙ | ○ | X |
| 45% by volume | ○ | ○ | X |
| 50% by volume | X | X | X |

The IR degradation resistance "x" indicates that the non-defective rate was about 0% to about 10%. The IR degradation resistance "Δ" indicates that the non-defective rate was about 10% to about 50%. The IR degradation resistance "○" indicates that the non-defective rate was about 50% to about 80%. The IR degradation resistance "⊙" indicates that the non-defective rate was about 80% to about 100%. As shown in Table 6, the IR degradation resistance was good when the amount of Cu powder added was set to be about 45% by volume or less.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An ESD protection device comprising:
    a ceramic element assembly including a glass component;
    a first discharge electrode and a second discharge electrode that are disposed on a same plane in the ceramic element assembly and that oppose each other with a gap therebetween;
    a discharge auxiliary electrode that connects the first discharge electrode to the second discharge electrode on the same plane; and
    a seal layer that is disposed between the discharge auxiliary electrode and the ceramic element assembly and that reduces or prevents a glass component in the ceramic element assembly from entering the discharge auxiliary electrode; wherein
    the seal layer includes a conductive component.

2. The ESD protection device according to claim 1, wherein a hollow portion is provided inside the ceramic element assembly, the hollow portion includes the gap between the first discharge electrode and the second discharge electrode, and the seal layer faces the hollow portion.

3. The ESD protection device according to claim 2, wherein at least a portion of the conductive component included in the seal layer is exposed to the hollow portion.

4. The ESD protection device according to claim 1, wherein an amount of the conductive component included in the seal layer is less than an amount of a conductive component included in the discharge auxiliary electrode.

5. The ESD protection device according to claim 1, wherein an amount of the conductive component included in the seal layer is 15% by volume or more and 45% by volume or less.

6. The ESD protection device according to claim 1, wherein
the seal layer is located at least in a region opposing the discharge auxiliary electrode with respect to the first discharge electrode and the second discharge electrode; and
the conductive component is included in only the seal layer located in the opposing region.

7. The ESD protection device according to claim 1, wherein the conductive component included in the seal layer is a same material as a conductive component included in the first discharge electrode and the second discharge electrode.

8. The ESD protection device according to claim 1, wherein
the seal layer is disposed along an inner surface of a hole portion in the ceramic element assembly and on the entire or substantially the entire inner surface of the hole portion;
a hollow portion is provided inside the ceramic element assembly, the hollow portion includes the gap between the first discharge electrode and the second discharge electrode, and the seal layer faces the hollow portion;
the seal layer is located at least in a region opposing the discharge auxiliary electrode with respect to the first discharge electrode and the second discharge electrode; and
the seal layer located in the opposing region includes the conductive component.

9. The ESD protection device according to claim 8, wherein in an XZ section including an X-direction in which the first discharge electrode and the second discharge electrode oppose each other and a Z-direction in which the first discharge electrode and the discharge auxiliary electrode oppose each other and the second discharge electrode and the discharge auxiliary electrode oppose each other, a maximum distance in the Z-direction of the hollow portion is less than a minimum distance in the X-direction of the gap between the first discharge electrode and the second discharge electrode.

10. The ESD protection device according to claim 8, wherein in an XZ section including an X-direction in which the first discharge electrode and the second discharge electrode oppose each other and a Z-direction in which the first discharge electrode and the discharge auxiliary electrode oppose each other and the second discharge electrode and the discharge auxiliary electrode oppose each other, a maximum distance in the X-direction of the hollow portion is more than a minimum distance in the X-direction of the gap between the first discharge electrode and the second discharge electrode.

11. The ESD protection device according to claim 1, wherein an area of a region surrounded by an outline of the seal layer is more than an area of a region surrounded by an outline of the discharge auxiliary electrode when viewed in a direction orthogonal or substantially orthogonal to the same plane.

12. The ESD protection device according to claim 11, wherein the region surrounded by the outline of the discharge auxiliary electrode is included in the region surrounded by the outline of the seal layer when viewed in the direction orthogonal or substantially orthogonal to the same plane.

13. The ESD protection device according to claim 1, wherein the conductive component includes insulating particles and conductive layers that cover the respective insulating particles.

14. The ESD protection device according to claim 1, wherein the conductive component includes conductive particles, and protruding portions are disposed on surfaces of the conductive particles.

15. The ESD protection device according to claim 1, wherein the discharge auxiliary electrode faces the gap.

16. The ESD protection device according to claim 1, wherein the ceramic element assembly includes a plurality of ceramic layers that are stacked and fired.

17. The ESD protection device according to claim 16, wherein the plurality of ceramic layers are made of low temperature co-fired ceramics including Ba, Al, and Si as primary components.

18. The ESD protection device according to claim 1, wherein the discharge auxiliary electrode includes a mixture of a conductive component and an insulating component.

19. The ESD protection device according to claim 18, wherein the conductive component of the discharge auxiliary electrode is Cu, Ag, Pd, Pt, Al, Ni, or W or a combination thereof.

20. The ESD protection device according to claim 1, wherein
the ceramic element assembly includes a hole portion; and
the seal layer is disposed along and on an entire or substantially an entire inner surface of the hole portion.

* * * * *